United States Patent
Waller, Jr. et al.

(10) Patent No.: US 6,831,514 B2
(45) Date of Patent: Dec. 14, 2004

(54) METHOD OF INCREASING OUTPUT CURRENT CAPABILITY OF NEGATIVE FEEDBACK AMPLIFIERS WITH OUTPUT CURRENT LIMITING AND FREEDOM FROM THERMAL RUNAWAY

(76) Inventors: James K Waller, Jr., 9901 Allen Rd., Clarkston, MI (US) 48348; Derek F. Bowers, 25518 Hidden Springs Ct., Los Altos Hills, CA (US) 94022

( * ) Notice: Subject to any disclaimer, the term of this patent is extended or adjusted under 35 U.S.C. 154(b) by 0 days.

(21) Appl. No.: 10/095,215
(22) Filed: Mar. 11, 2002
(65) Prior Publication Data

US 2004/0080371 A1 Apr. 29, 2004

(51) Int. Cl.$^7$ ................................................. H03F 3/45
(52) U.S. Cl. ........................ 330/255; 330/289; 330/298
(58) Field of Search ................................ 330/255, 256, 330/260, 261, 267, 207 P, 289, 298

(56) References Cited

U.S. PATENT DOCUMENTS 4,194,165 A * 3/1980 Skulski ..................... 330/255
6,107,884 A * 8/2000 Gorcea ..................... 330/255

* cited by examiner

*Primary Examiner*—Henry Choe
(74) *Attorney, Agent, or Firm*—Frank J. Catalano

(57) ABSTRACT

A high output current negative feedback power amplifier amplifies an input signal by use of a monolithic operated amplifier with a current limiting resistor in its output path. The output current of the amplifier is automatically increased when the voltage drop across the current limiting resistor increases beyond a predetermined point and global current limiting automatically occurs when the output current of the monolithic amplifier exceeds a predetermined point.

1 Claim, 9 Drawing Sheets

METHOD OF INCREASING OUTPUT CURRENT CAPABILITY OF NEGATIVE FEEDBACK AMPLIFIERS WITH OUTPUT CURRENT LIMITING AND FREEDOM FROM THERMAL RUNAWAY

BACKGROUND

Negative feedback amplifiers are widely used to provide low distortion gain in many electronic systems. The widespread use of such amplifiers has led to the availability of one of the most general purpose negative feedback amplifiers, the operational amplifier, in the form of low-cost monolithic integrated circuits. Some electronic systems, notably servo controllers and audio power amplifiers, require that the negative feedback amplifier deliver a substantial amount of power to the load. Accordingly, in addition to the large number of general purpose operational amplifiers commercially available (which are usually limited to less than half a watt of output power), several manufacturers have developed operational amplifiers (often monolithic) with output powers in excess of fifty watts. An example of such a (monolithic) operational amplifier is the LM3886 from National Semiconductor Corporation, which can deliver 60 watts of power, and is primarily intended for audio applications.

One feature, which is considered important for such high power amplifiers is the ability to withstand the effects of (usually unintentional) loads which attempt to draw more power from the amplifier than it can safely provide. An accidental short circuit from the output to ground is an example of such an excessive load. One protection system commonly used is to limit the maximum output current of the amplifier to a value independent of the load. This avoids fusing of devices internal to the amplifier, which gives short-term protection in the case of a short circuit or other overload. Unfortunately, even with current limiting, the presence of such an overload for an extended period of time can cause failure of the amplifier due to excessive internal power dissipation and subsequent overheating. To overcome this problem, a second form of protection is frequently incorporated, which senses the temperature of the amplifier and removes the ability of the amplifier to supply output current when a safe temperature has been exceeded. This is known as thermal shut down. It is thus common for commercial amplifiers to feature both current limiting and thermal shut down, and the LM3886, for example, includes both types of protection.

For some applications, the output power provided by monolithic amplifiers such as the LM3886 is insufficient, and it is therefore desirable to find a way of obtaining more power from such amplifiers. Since power is the product of voltage and current, increasing either can theoretically raise the power. This invention is concerned with a method of increasing the overall current available to the load in a system employing a commercially available amplifier (such as the LM3886). Such techniques are in common use, but most cause the output protection features of the commercial amplifier to become ineffective when they are employed. A key feature of this invention is the ability to retain the protection characteristics of the commercial amplifier even though the current available to the load has been greatly increased. A further feature of the invention is to accomplish this with a small number of components, leading to a very high power amplifier with extremely low manufacturing cost.

DESCRIPTION OF THE INVENTION

Figure 1:
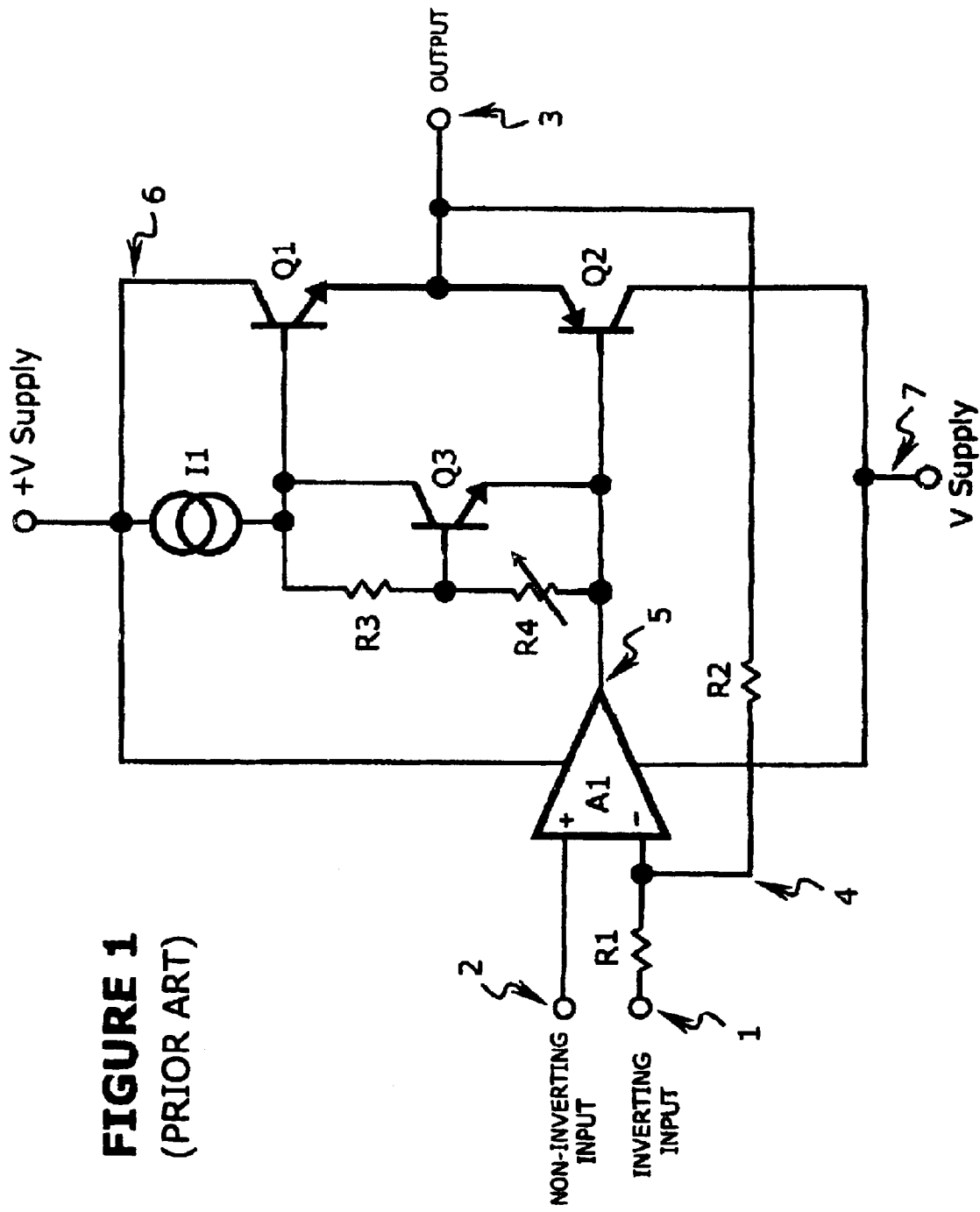
FIG. 1 is a schematic diagram showing a prior art method of providing output current improvement to an operational amplifier.

FIG. 1 shows a conventional method of providing "current boost" to an existing operational amplifier (A1). External complementary bipolar transistors, Q1 & Q2, operating in common-collector mode, are added between the output of A1 (node 5) and the final output (node 3). The current gain of these transistors means that A1 is now only supplying base current to Q1 & Q2, so that the final output current can be much greater than the capability of A1 by itself. Unfortunately, direct connection of the base of Q1 to node 5 would produce a "dead band" in the transfer function as the load current passed through zero, due to the finite base-emitter voltages of Q1 & Q2 (approximately 600 millivolts). This "dead band" can produce undesirable distortion in the overall transfer characteristic of the amplifier. To overcome this, The network consisting of Q3, R3, R4 and 1 is added. This provides a bias voltage (approximately 1.2 volts) between the bases of Q1 & Q2. This causes both Q1 and Q2 to conduct slightly as the load current passes through zero, effectively removing most of the "dead band".

Overall feedback around the amplifier is provided by resistors R1 & R2. The feedback is taken from node 3 rather than node 5 to incorporate the network Q1–Q3, & R3–R4 inside the feedback loop, eliminating most of the distortion caused by this network. The circuit can work in the inverting or non-inverting mode. With node 1 connected to ground an with an input signal applied to node 2, the overall gain (G) will be given by: −G=(R2/R1)+1 (non-inverting mode). With node 2 connected to ground and an input signal applied to node 1, the overall gain will be given by: −G=−(R2/R1) (inverting mode).

There are several problems with this circuit, however.

Firstly, transistors with adequate current handling characteristics to serve as Q1 & Q2 are either very expensive or are simply not available for output currents above 10 amperes or so.

Secondly, The setting of the bias voltage between the bases of Q1 & Q2 is somewhat critical. Too high a voltage, and the transistors will conduct a large amount of current even when the load current is zero. Too low a voltage, and elimination of the "dead band" will be incomplete. This criticality is made even more troublesome by the fact that the bias voltage varies greatly with the characteristics of Q1 & Q2 (which are subject to substantial manufacturing variations) and also changes with temperature. To alleviate the latter problem, it is vital that the transistor Q3 be maintained at the same temperature as Q1 & Q2, which is somewhat awkward to implement. To overcome the former problem, the bias voltage must be individually adjusted for each unit (one way of doing this is to adjust the value of R4). This obviously adds to the cost of production.

Finally, Even if the amplifier A1 has internal current limiting to provide protection in case of a short circuit at the output, it will not be effective in protecting the overall amplifier. This is because the output current is amplified by the current gains of Q1 & Q2, which are subject to wide manufacturing variations, change with temperature, and, also are usually different for NPN transistors (Q1) and PNP transistors (Q2).

Figure 2:
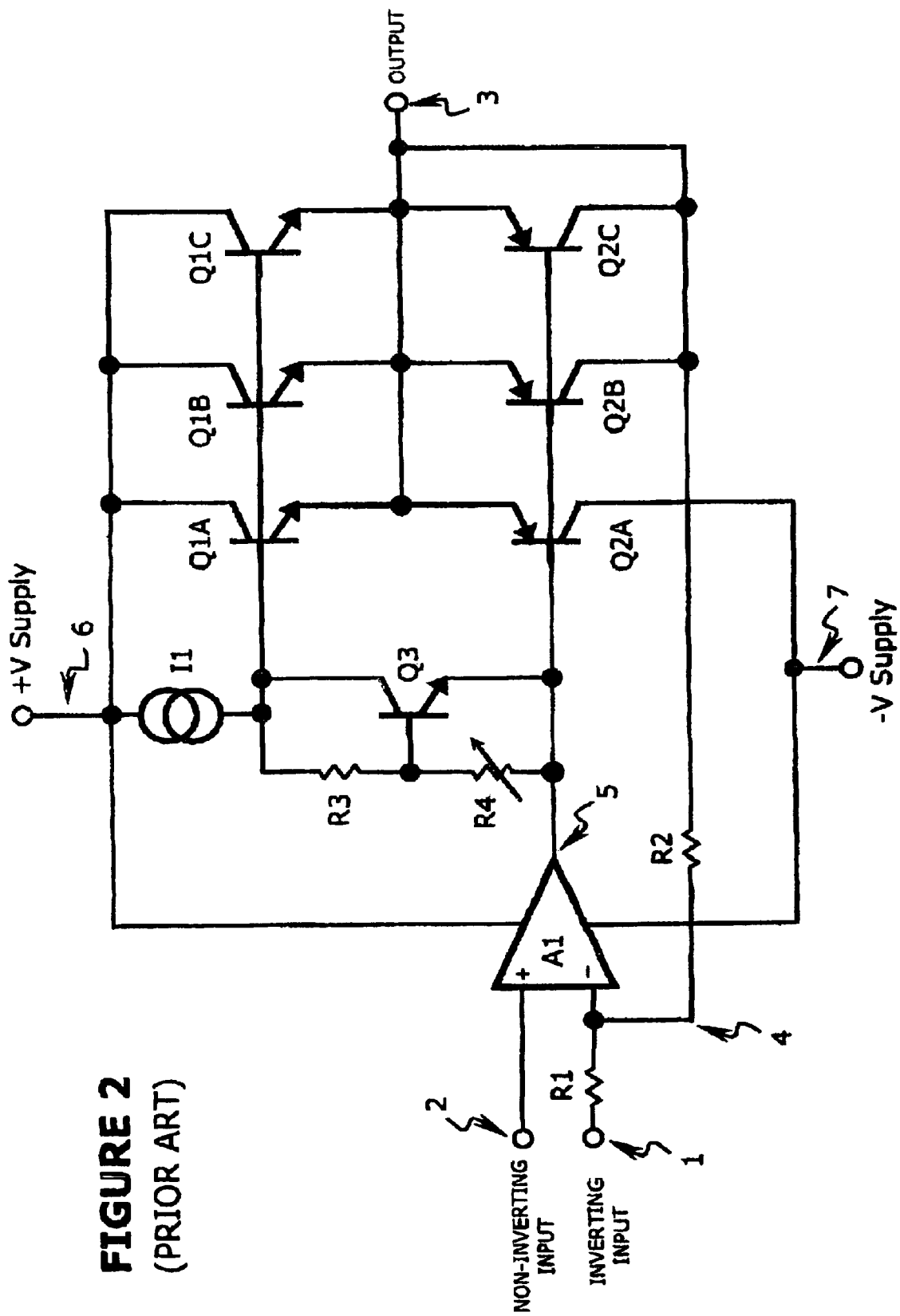
FIG. 2 is a schematic diagram showing a prior art method of providing additional output current to the circuit of FIG. 1 by the use of multiple output transistors.
Figure 3:
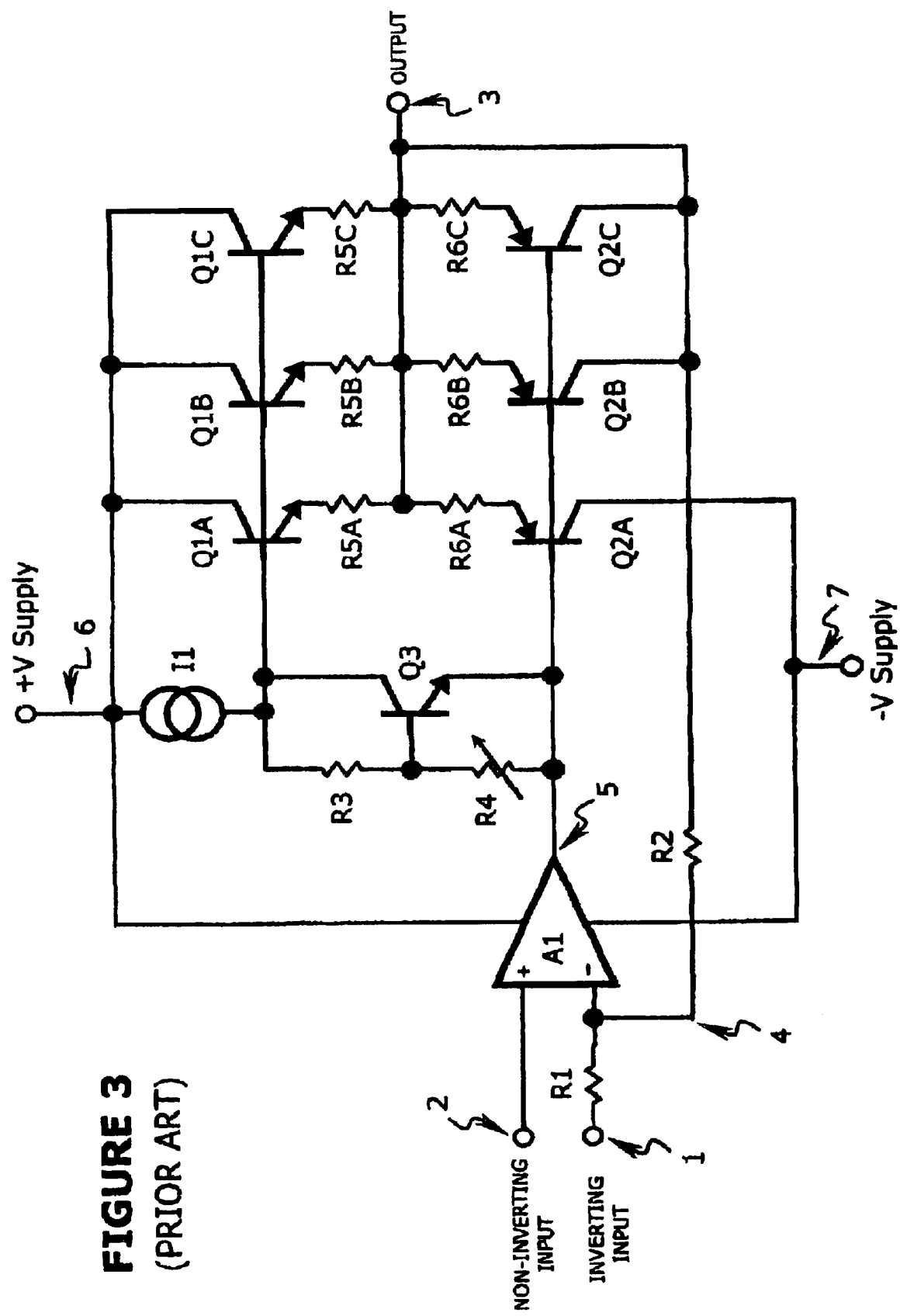
FIG. 3 is a schematic diagram showing a prior art method of ensuring equal current sharing among the multiple output transistors of FIG. 2.

To overcome the first problem with the circuit of FIG. 1, it is common to replace the transistors Q1 & Q2 with multiple devices. FIG. 2 shows the simplest way of accomplishing this, shown here (and in subsequent figures) with a multiple of three, but there is nothing to prevent other multiples from being used. Transistor Q1, has been replaced with three devices connected in parallel, Q1A, Q1B & Q1C. Similarly Q2 has been replaced with Q2A, Q2B and Q2C. The idea is to divide the load current equally among the transistors, but unfortunately due to manufacturing variations in the individual transistors, this division is far from equal in practice. An even more severe problem is that these transistors will naturally heat up as they conduct more current, and if there is unequal current division there will be unequal heating also. An unfortunate characteristic of a bipolar transistor is that its base-emitter voltage reduces with temperature increase, by an amount equal to approximately −2 mV/K. Thus if one transistor is hotter than the others with which it is connected in parallel, it will conduct even more current as it heats up. This leads to a condition known as "thermal runaway" where one transistor ends up conducting most of the output current and as a result heats up sufficiently to destroy itself. The usual way of preventing this occurrence is shown in FIG. 3.

In this case, instead of connecting the transistors directly in parallel, small resistors, R5A,R5B,R5C,R6A,R6B & R6C (on the order of 0.05 to 1 ohm) are inserted in the emitters of the individual transistors. The presence of these resistors prevent variations in base-emitter voltage among the transistors from causing large variations in individual device currents, and "thermal runaway" is avoided.

Figure 4:
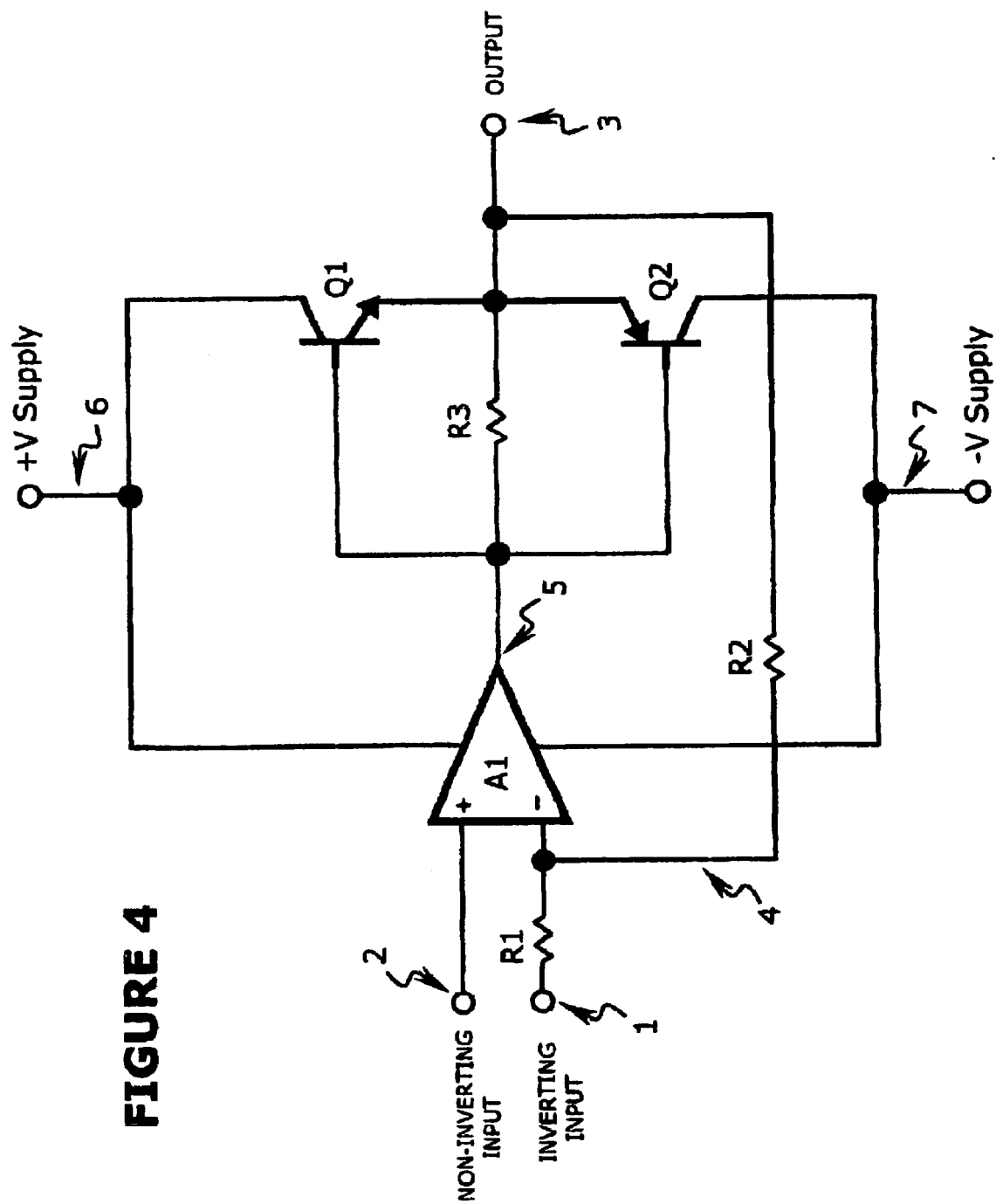
FIG. 4 is a schematic diagram of the invention showing one method of providing output current improvement to an operational amplifier while also offering short circuit protection.
Figure 5:
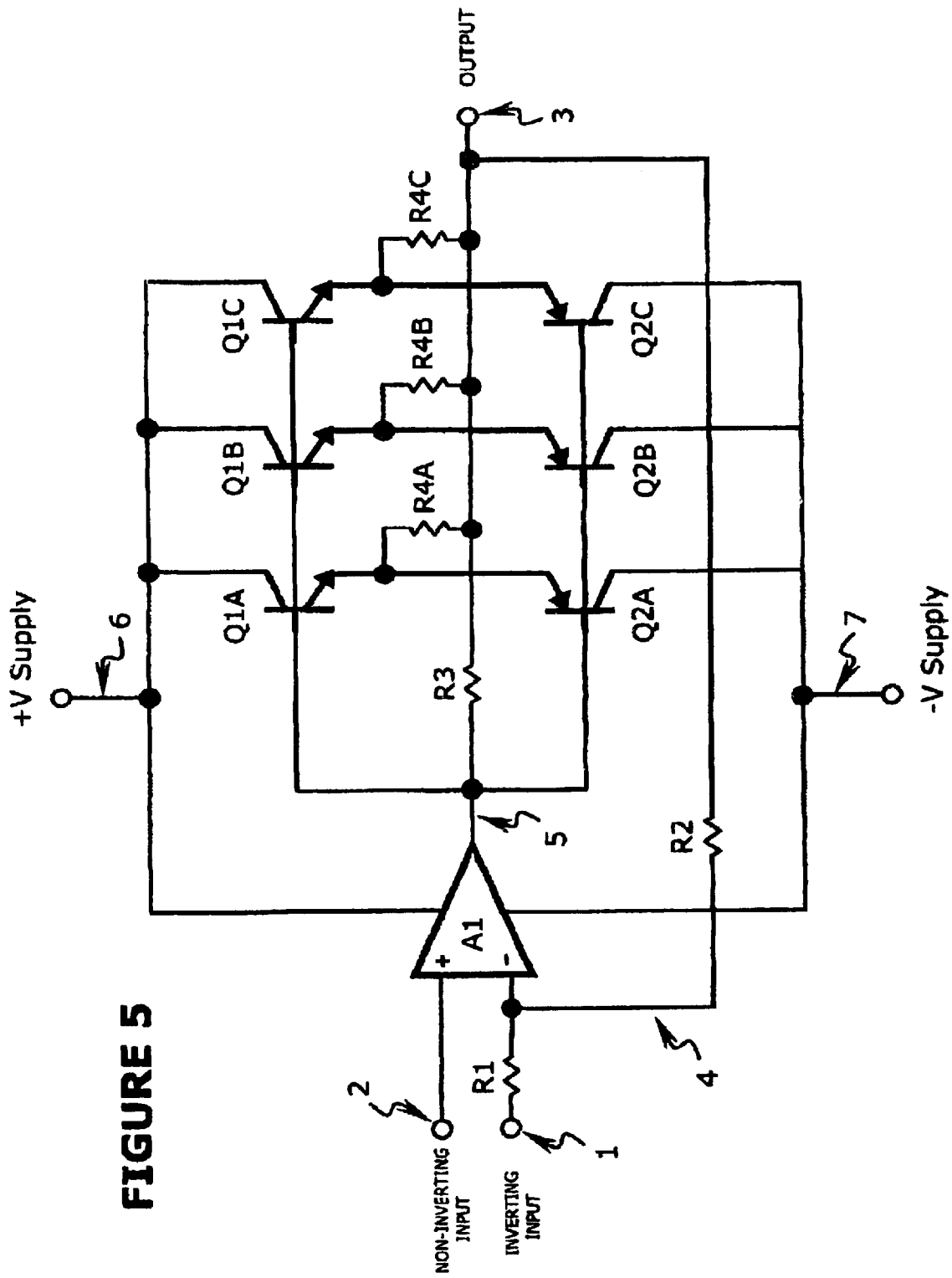
FIG. 5 is a schematic diagram showing a new method of adding multiple output devices to the circuit of FIG. 4 such that equal current sharing is ensured.
Figure 6:
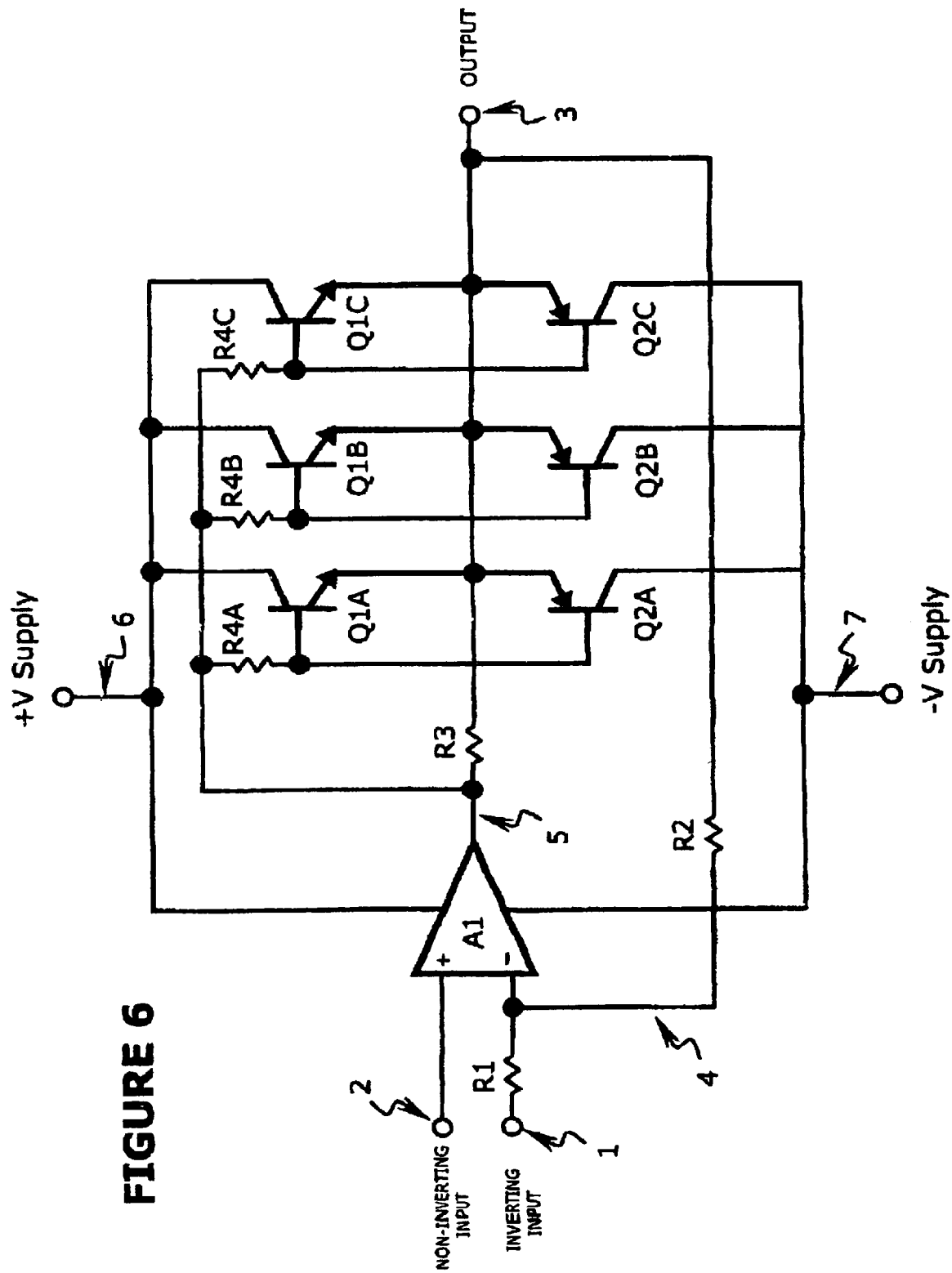
FIG. 6 is a schematic diagram showing an alternative embodiment of FIG. 5.

FIG. 4 shows the most simplified embodiment of the invention. Here the transistors Q1 and Q2 are operated with no bias voltage between their bases, and so exhibit a substantial "dead band". The effect of this "dead band" is however, largely circumvented by the presence of R3 which allows the output current from amplifier A1 to pass directly to the final output (node 3) when both Q1 and Q2 are conducting insignificant current, which is the case during the "dead band". As the demand for output current increases the voltage drop across R3 will increase to the point where Q1 and Q2 will become active. By selecting the appropriate value for resistor R3 output short circuit protection is provided by the internal current limiting circuit of A1. Under the presence of a severe output overload condition, such as a short circuit at the output, one of the transistors Q1 or Q2 (depending on the polarity of the input signal) will attempt to deliver excessive current to the output terminal. The output current is a combination of the current through R3 and the base current of Q1 or Q2 (whichever is conducting) multiplied by the current gain of Q1 or Q2. By properly selecting the value of R3, A1's internal current limiting circuit will become active when the demand for output current from Q1 or Q2 reaches the limit of their safe operating current and global current limiting which also protects Q1 and Q2 is achieved. Thus the circuit of FIG. 4 can be configured such that when the limit beyond which destructive amounts of output current is reached the internal short circuit protection of A1 will also provide current limiting of the base current for the output transistors Q1 and Q2. As in the case of a dead short on the output, the internal thermal protection circuit in A1 will also become active very quickly thereby providing additional global thermal protection. The present invention disclosure also discloses improvements to the circuit of FIG. 4. The first improvement concerns the replacement of Q1 & Q2 with multiple devices. A major difference between FIG. 1 and FIG. 4 is that the transistors Q1 & Q2 in FIG. 4 are never conducting at the same time. This simplifies the addition of multiple devices as shown in FIG. 5. The emitter resistors (R4A, R4B & R4C) are still required, but now there is only one resistor per complementary pair of transistors, instead of one per transistor as in FIG. 3. The reason this is acceptable is because the lack of a bias voltage between the transistor bases means that there is no danger of Q1A turning on at the same time as Q2A (and so on for Q1B & Q1C). Thus the only danger of thermal runaway is because of unequal current among the complementary pairs rather than the individual transistors themselves. This saving of resistors sounds meager, but resistors capable of carrying large currents are not inexpensive. Of course, this cost could be even lower if the current in the resistors could be reduced, and a way of accomplishing this is shown in FIG. 6. Here the resistors are placed in series with the bases of the complementary transistor pairs, instead of the emitters. The current they carry is thus reduced by a factor equal to the current gain of the transistors. The voltage drop across them is also reduced by the same factor, but this is easily corrected by increasing the value of the resistors by a factor equal to the current gain. As mentioned previously, the transistor current gains are subject to significant manufacturing variations, and thus this method is not as effective as the one in FIG. 5. Nevertheless, it does provide a substantial degree of "thermal runaway" prevention at a very low cost.

The second improvement concerns additional circuitry, which retains the internal current limiting of A1, thus addressing the last problem of the circuit of FIG. 1 discussed previously.

Figure 7:
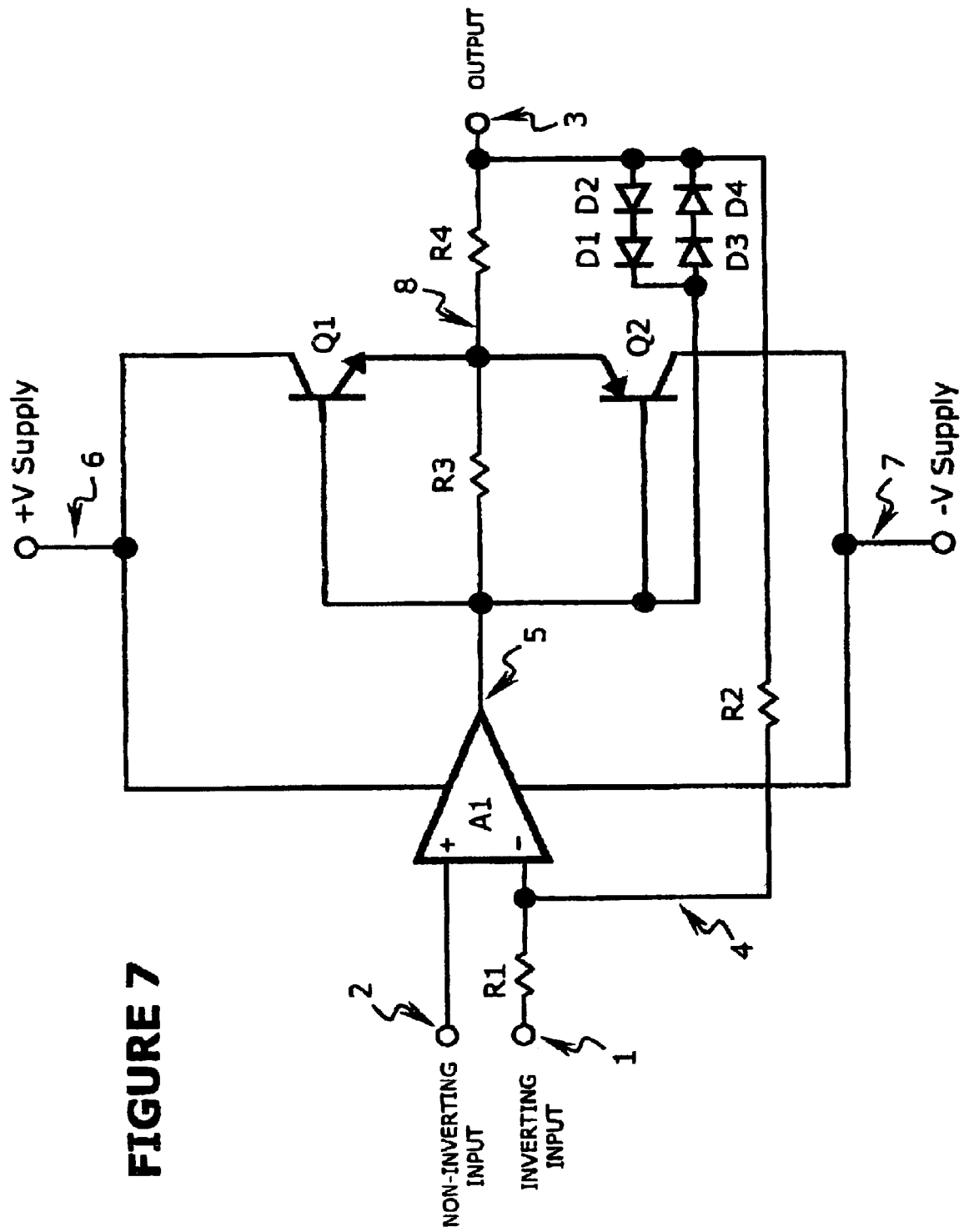
FIG. 7 is a schematic diagram showing a new method of adding current limiting to the circuit of FIG. 4.

Referring to FIG. 7, this is essentially the same circuit as in FIG. 4 with the addition of resistor R4 and diodes D1–D4. Under normal circumstances, R4 carries all of the output current and its value is chosen such that the voltage across it never exceeds approximately 400 millivolts. Due to the base-emitter voltages of Q1 & Q2, the difference in potential between node 5 and node 8 is limited to approximately plus or minus 700 millivolts. In conjunction with the maximum voltage across R4, this results in a worst case voltage between node 5 and node 3 of 1.1 volts. This voltage is insufficient to cause the diodes D1–D4 to conduct significant current (a small amount of current is not detrimental to the circuit performance). Under the presence of a severe output overload condition; such as a short circuit at the output, one of Q1 or Q2 (depending on the polarity of the input signal)

will attempt to deliver excessive current to the output terminal. This current must flow through R4, but now the voltage drop across R4 is no longer limited to its usual 400 millivolt limit. If the output current is being supplied by Q1, then this will cause diodes D3 & D4 to start conducting significant current, which can only be provided from the output terminal (node 5) of amplifier A1. If amplifier A1 incorporates current limiting, then the maximum current available for D3 and D4 is limited to a safe value. Furthermore, as this current becomes diverted from the output terminal of A1, there is less current available to supply the base current for Q1. If R4 is chosen such that the current through it under these conditions is below the current that Q1 can safely supply, then an equilibrium is reached where no component is operating above its safe limits. For example, if the typical drop across D3 or D4 is 700 millivolts, Vbe is the base-emitter voltage of Q1, and Q1 can safely supply 5 amperes, then R4 should be chosen such that R4=(V(D3)+V(D4)−Vbe(Q1))/5 amperes, or around 0.14 ohms. If the output current is being supplied by Q2, then the same equation applies replacing Q1 by Q2, D3 by D1 and D4 by D2.

Figure 8:
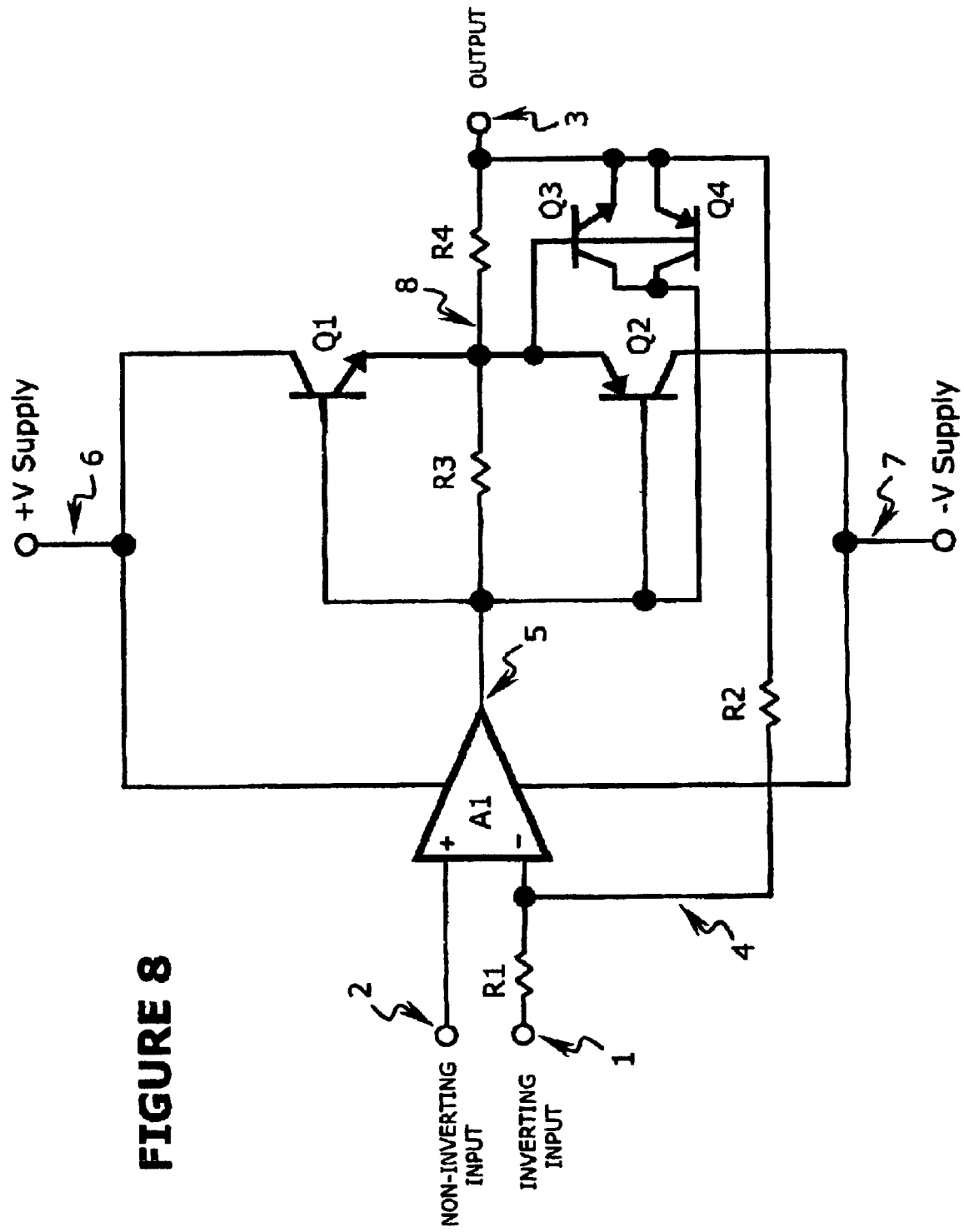
FIG. 8 is a schematic diagram showing an alternative embodiment of FIG. 7.

FIG. 8 shows another way of implementing the current limiting. In this case the four diodes are replaced by two extra complementary transistors, Q3 & Q4. Whenever the voltage drop across R4 is sufficient to turn on one of the latter transistors (again depending upon whether Q1 or Q2 are providing the output current at this point), transistor action steers current from the output node of A1 (node 5) directly to the output terminal (node 3). As in the case of the circuit of FIG. 7, the current thus diverted from the output terminal of A1 is unavailable to provide base current for either Q1 or Q2. In this case, the value of R4 is set by the desired maximum output current in conjunction with the base-emitter voltage required to turn on Q3 or Q4 to an extent where the maximum output current of amplifier A1 is diverted directly into the final output terminal (node 3). Typically, the base-emitter voltages of Q3 & Q4 will be around 700 millivolts under these conditions, in which case the value of 0.14 ohms previously calculated should yield similar results.

The circuit of FIG. 8 is conceptually simpler than that of FIG. 7, but it should be noted that in the case of the circuit of FIG. 8 that the transistors Q3 & Q4 must absorb the maximum current limit of amplifier A1 with a very low collector to base voltage (approximately 700 millivolts). It takes a transistor with very low collector resistance to perform this function whilst avoiding saturation, and such transistors may add to the overall cost. The circuit of FIG. 7 may actually be a lower cost alternative, in spite of its apparent extra complexity.

Figure 9:
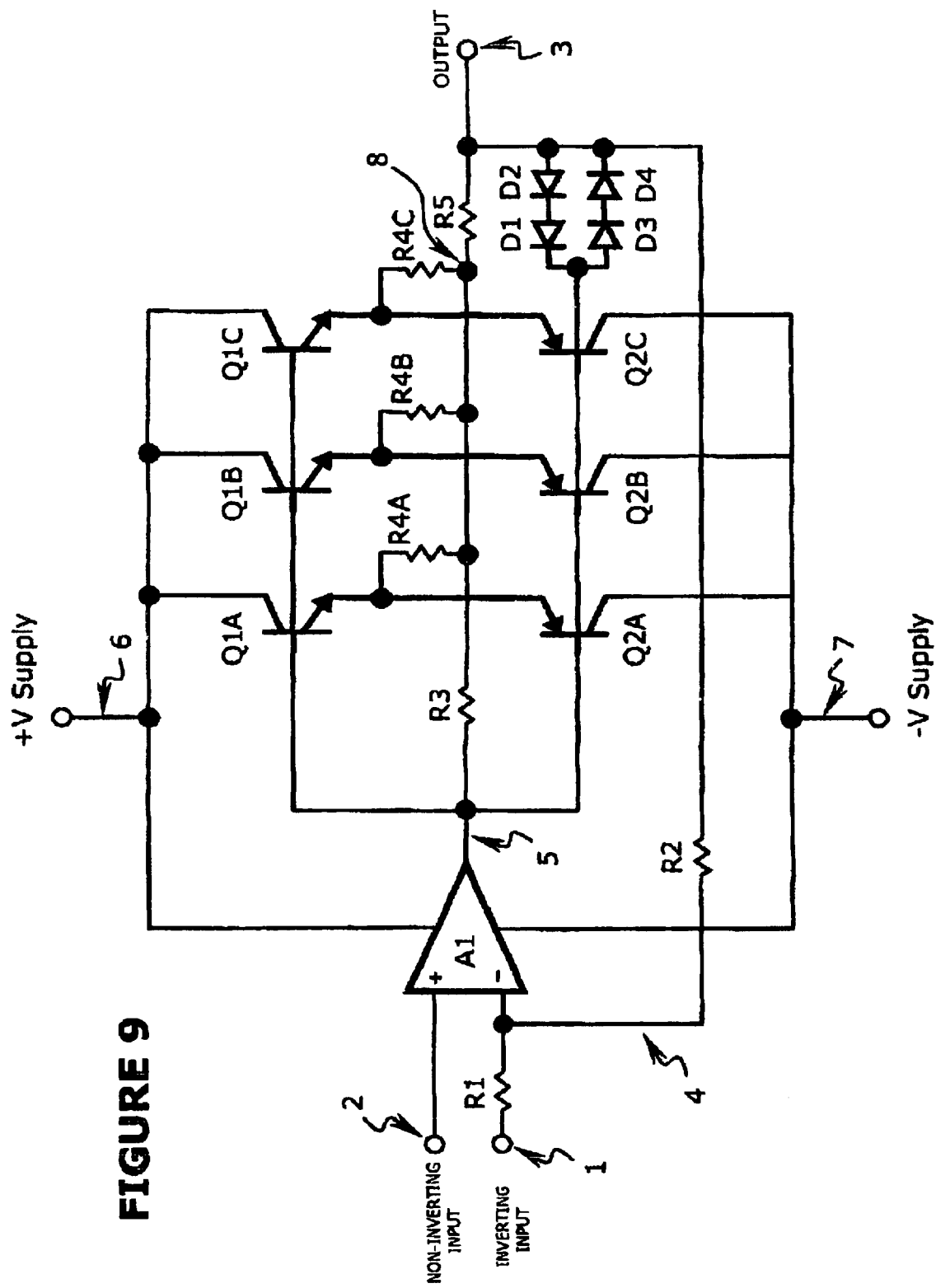
FIG. 9 is a schematic diagram showing how the circuits of FIG. 5 and FIG. 7 can be combined such that both are effective simultaneously.

The improvements shown in FIG. 5 and FIG. 6 can be combined with the improvements shown in FIG. 7 and FIG. 8, to yield an amplifier with multiple output devices and output current limiting. All combinations are possible, but an example is shown in FIG. 9, which is a combination of the multiple output device circuit of FIG. 5 and the current limiting circuit of FIG. 7.

It was noted earlier that many commercially available amplifier blocks (such as the LM3886) feature protection from excessive self heating in the case of an overload condition which persists for an extended period of time. If such an amplifier is used as the amplifier block (A1) in the circuits of FIGS. 5–9, then this feature will not necessarily prevent destruction of the external output transistors, Q1 & Q2 (and multiples thereof) by self heating of the transistors themselves. If the amplifier block (A1) is placed in close proximity to the latter transistors, preferably by solid mechanical attachment to a substance of high thermal conductivity (such as an aluminum "heat sink"), then any overheating of the transistors will also be conveyed to the amplifier block. This will activate the thermal protection of the amplifier block, even though the latter device is not inherently delivering enough current to heat itself into thermal limiting. Thus, thermal limiting of the entire circuit can be attained.

What we claim is:

1. A high output current negative feedback power amplifier comprising:

means for amplifying an input signal utilizing a monolithic operational amplifier; means for providing a current limiting resistor in the output signal path of said monolithic operational amplifier;

means for increasing the output current of the amplifier when the voltage drop across said current limiting resistor increases beyond a predetermined point;

means for providing global current limiting when the output current of said monolithic operational amplifier exceeds a predetermined point.

* * * * *